(12) United States Patent
Yoshida

(10) Patent No.: US 6,340,393 B1
(45) Date of Patent: Jan. 22, 2002

(54) METHOD FOR SYNTHESIZING N-TYPE DIAMOND HAVING LOW RESISTANCE

(75) Inventor: Hiroshi Yoshida, Kawanishi (JP)

(73) Assignee: Japan Science and Technology Corporation, Kawaguchi (JP)

(*) Notice: Subject to any disclaimer, the term of this patent is extended or adjusted under 35 U.S.C. 154(b) by 0 days.

(21) Appl. No.: 09/508,053
(22) PCT Filed: Jun. 24, 1999
(86) PCT No.: PCT/JP99/03383
§ 371 Date: Mar. 7, 2000
§ 102(e) Date: Mar. 7, 2000
(87) PCT Pub. No.: WO00/01867
PCT Pub. Date: Jan. 13, 2000

(30) Foreign Application Priority Data

Jul. 7, 1998 (JP) .............................. 10-208611

(51) Int. Cl.$^7$ .............................. C30B 29/04
(52) U.S. Cl. .............. 117/86; 117/104; 117/68; 117/930; 423/446
(58) Field of Search .............. 117/68, 86, 104, 117/930; 423/446

(56) References Cited

FOREIGN PATENT DOCUMENTS

| JP | 62-70295 | 3/1987 |
| JP | 5-117088 | 5/1993 |
| JP | 5-117089 | 5/1993 |
| JP | 5-345696 | 12/1993 |
| JP | 6-214030 | 8/1994 |
| JP | 7-69794 | 3/1995 |
| JP | 9-20593 | 1/1997 |
| JP | 10-149986 | 6/1998 |
| JP | 10-247624 | 9/1998 |

OTHER PUBLICATIONS

Moench et al., "Hydrogen–modification of electronic surface, bulk, and interface properties of silicon", Physica Status Solidi A vol. 159 No. 1 pp. 25–37, Jan. 1997.*

* cited by examiner

Primary Examiner—Robert Kunemund
(74) Attorney, Agent, or Firm—Armstrong, Westerman, Hattori, McLeland & Naughton, LLP

(57) ABSTRACT

In synthesizing a diamond by a vapor-phase growth method, a sputtering method, or a high-pressure and high-temperature synthesis method, N, P or As as an n-type dopant, and H as a p-type dopant are simultaneously doped in a crystal to form a donor-acceptor pair in the crystal, to thereby synthesize a transparent n-type diamond having low resistance.

11 Claims, 2 Drawing Sheets

METHOD FOR SYNTHESIZING N-TYPE DIAMOND HAVING LOW RESISTANCE

FIELD OF THE INVENTION

This invention relates to a method for synthesizing an artificial diamond, and more specifically, to a method for synthesizing a transparent n-type diamond having low resistance in manufacturing a diamond by a vapor-phase growth method, a sputtering method, a high-temperature and high-pressure synthesis method, or the like.

TECHNICAL BACKGROUND

As a method for synthesizing a diamond, a method for artificially synthesizing a diamond from a graphite carbon by using a catalyst under high-temperature and high-pressure (50 kbr, 1500 k or more), and a method for synthesizing a diamond thin film on a substrate by a CVD method from a mixed gas of a hydrocarbon and a hydrogen under low pressure (<1 Torr) and high temperature (>800° C.), or the like, are known. Japanese Patent Unexamined Laid-open Publication No. S62(1987)-70295 discloses a method for manufacturing an n-type semiconductor diamond thin film. According to the method, a reaction gas comprising a gas including P, As or Sb as a dopant element, a hydrocarbon gas and hydrogen is decomposed by heat or decomposed by plasma to be evaporated on a substrate by a microwave plasma CVD method or a thermal decomposing CVD method, to thereby manufacture an n-type semiconductor diamond thin film.

The above-mentioned plasma CVD method and thermal decomposing CVD method have drawbacks such that it is troublesome to execute the method due to the high-temperature processing, the obtained film is easily broken due to the residual stress maintained in the film, and it is difficult to control an amount of dopant. As a method for solving these problems, Japanese Patent Unexamined Laid-open Publication No. H5(1993)-345696 discloses a method for manufacturing a diamond thin film, which is excellent in hardness, corrosion resistance, heat resistance, and the like, and is possible to be applied to a high temperature electric equipment. In the method, a dopant ion beam is simultaneously introduced when a film is growing at low temperature by sputtering an ion beam.

Furthermore, a method for forming a p-type or n-type diamond is also known (Japanese Patent Unexamined Laid-open Publication Nos. H5(1993)-117088 and H5(1993)-117089). In the method, an electron beam or excimer laser is irradiated toward a surface of a single crystal diamond to activate a dopant disposed on the single crystal diamond, so that the dopant is diffused therein. Also known is an n-type semiconductor diamond in which nitrogen atom of $1 \times 10^{19}$ $cm^{-3}$ or more is doped (Japanese Patent Unexamined Laid-open Publication No. H7(1995)-69794). Furthermore, it is also known that, in forming an n-type diamond single crystal by a vapor-phase growth method, in order to prevent a reaction of gases due to corrosion thereof before reaching a substrate, each gas is directly supplied in a molecular flow state to the substrate (Japanese Patent Unexamined Laid-open Publication No. H10(1998)-149986).

Furthermore, the inventor invented a method for obtaining a single crystal diamond excellent in crystallization (Japanese Patent Unexamined Laid-open Publication No. H9(1997) -20593). In the method, an amorphous carbon hydride is formed by adding a hydrogen to a carbon, rapidly cooling a decomposed carbon gas hydride on a substrate, or sputtering a graphite by hydrogen atom, and atoms are rearranged into a crystal diamond under low temperature by forming atomic holes and interstitial atom pairs in the amorphous carbon hydride, to thereby effectively cause a movement of the interstitial atom. The single crystal diamond obtained by this method meets characteristics required by various semiconductor materials and optical semiconductor materials requiring a highly controlled crystallization.

(Problems to be Solved by the Invention)

A p-type diamond thin film having low resistance can be easily manufactured by a conventional technique. Although an n-type diamond having high resistance can be manufactured, it is difficult to manufacture an n-type diamond thin film having low resistance because it is impossible to activate at room temperature (300° K) due to the self-compensation effect and the deep donor level (500 meV).

If an n-type diamond having low resistance can be synthesized as a single crystal diamond thin film, by combining it with a p-type diamond having low resistance, which is already realized by doping impurities, it is possible to manufacture a high power and high speed semiconductor device using a diamond operable at high temperature and an ultraviolet semiconductor laser diode made of diamond, which is essential for a high density recording and a vast information transmittance.

It is also possible to manufacture a transparent n-type single crystal protective film utilizing high hardness of a diamond, which is excellent in electric conductivity and thermal conductivity. Furthermore, by utilizing the negative electron affinity energy of a diamond, it is possible to manufacture a display having a large surface area made by highly efficient electron beam materials of an n-type diamond having low resistance.

To form an n-type diamond having low resistance means to delete the deep donor level due to N in a synthesized diamond and change the deep level to a shallow level, whereby an absorption of natural light (sun light) is prevented, to thereby extinguish the color caused by the deep level of the single N in the synthetic diamond. This is the same as in forming a transparent synthesized diamond by forming an n-type diamond having low resistance. In synthesizing a diamond by a high-temperature and high-pressure synthetic technique utilizing nickel catalyst or the like, it becomes possible to manufacture a transparent diamond valuable as a jewel.

(Means for Solving the Problems)

The inventor has found the facts that, in order to solve the aforementioned problems, in forming a single crystal diamond thin film on a substrate by a vapor-phase growth method or a sputtering method, by simultaneously doping a p-type dopant and an n-type dopant, it becomes possible to stabilize an n-type dopant in a high densitys, lower an impurity level and greatly increase the number of carriers, to thereby synthesize a high quality single crystal diamond thin film having low resistance.

The inventor has also found the following fact. That is, in synthesizing an artificial diamond by a conventional high-temperature and high-pressure synthesizing method utilizing nickel catalyst or the like, by mixing H as a p-type dopant and N, P or As as an n-type dopant at the atomic density ratio of 1:2 to 1:3 before synthesizing, a donor-acceptor compound, such as a P—H—P pair, an N—H—N pair or a As—H—As pair, is formed in a crystal, to lower the impurity level as compared to a single doping to thereby form an n-type diamond having low resistance. This results in a transparent artificial diamond, wherein a conventional artificial diamond made by a conventional method had color because the natural light is absorbed by the deep impurity level of N.

In other words, the method according to the present invention is based on a principle that, regardless of a method for synthesizing a diamond, by simultaneously doping H as an acceptor and P, N, or As as a donor at the atomic density ratio of 1:2 to 1:3, an acceptor-donor complex (compound) is formed, resulting in a decreased donor level. According to this principle, a diamond in a metallic state (0.001 $\Omega$cm) can also be made.

As shown in FIG. 1, by forming a P—H—P pair, an N—H—N pair or a As—H—As pair (complex) by a simultaneous doping, electron scattering due to an n-type carrier dopant is decreased, and the movement of the electron is greatly increased. This lowers the donor level to thereby increase the carrier density in a diamond crystal, which increases the activation rate by 10 to 1000 times, resulting in an n-type diamond having lower resistance.

In the diamond crystal, H as an acceptor and N, P, or As as a donor take a structural position (an impurity complex) forming the crystal model shown in FIG. 2. The positioning of the acceptor atom H between the donor atom (P, N, As) and the donor atom (P, N, As) stabilizes the crystallography structural position. Accordingly, donors can be doped in higher density.

In the method according to the present invention, N, P or As as an n-type dopant in the form of atom and H as a p-type dopant in the form of atom electrically excited by a radio wave, a laser, an x-ray, an electron beam, or the like, are simultaneously doped. Furthermore, a carbon vapor partial pressure, an n-type dopant partial pressure and a p-type dopant partial pressure are controlled so as to increase the n-type dopant atomic density such that the atomic density of the n-type dopant is larger than that of the p-type dopant.

Furthermore, the present invention provides a method for removing H as a donor from the crystal. In the method, a single crystal thin film of the synthesized diamond is cooled once, and annealed at high temperature for a short time in an electric field, so that the donor made of hydrogen is removed from the crystal.

Furthermore, the present invention provides a method for forming a high efficiency spinpolarized electron-beam material. In the method, a circular polarized laser is irradiated to a single crystal thin film of a synthesized diamond.
(Function)

By simultaneously doping an n-type dopant and a p-type dopant, electrostatic energy or lattice energy therebetween is decreased, which stabilizes an n-type dopant and enables a stable doping of the n-dopant in high density, resulting in low resistance.

Furthermore, by simultaneously doping an n-type dopant and a p-type dopant, a pair of an n-type dopant and a p-type dopant is formed in a diamond crystal, which decreases electron scattering of n-type carrier due to an n-type carrier dopant, to thereby increase the carrier movement, resulting in low resistance. In other words, according to the present invention, a diamond single crystal thin film having a film thickness of about 0.01 to about 1 $\mu$m and a film resistance of 1.0 $\Omega$cm or less can be obtained.

THE BEST MODE FOR CARRYING OUT THE INVENTION

In the present invention, a vapor-phase growth method denotes, for example, an organometallic method utilizing a compound gas (MOCVD method) and a molecular beam epitaxy method utilizing an atomic beam (MBE method). A sputtering method denotes, for example, a sputtering of a graphite by a hydrogen atom and other various methods applicable for synthesizing a diamond thin film.

For example, in the MBE method, carbon gas hydride is decomposed under sufficient hydrogen conditions, and is accumulated to be crystalized on a semiconductor substrate at low temperature, so that an n-type single crystal diamond thin film of low resistance is formed. In place of the method in which carbon gas hydride is decomposed, a method in which hydrogen in the form of plasma is added to carbon may be used. In the MOCVD method or the MBE method, a gas which generates a large amount of hydrogen such as tributylphosphine may be used as a doping material.

By simultaneously doping an atomic n-type dopant (donor) and an atomic p-type dopant (acceptor), a donor-acceptor pair is formed in a crystal to decrease the electrostatic energy or lattice energy therebetween, resulting in a stable doping of the n-type dopant in high density. Furthermore, since the donor-acceptor compound is formed, the donor level greatly decreases. Thus, high power and high speed diamond semiconductor device materials operable at high temperature, or high efficiency electron beam materials, can be manufactured.

Figure 1:
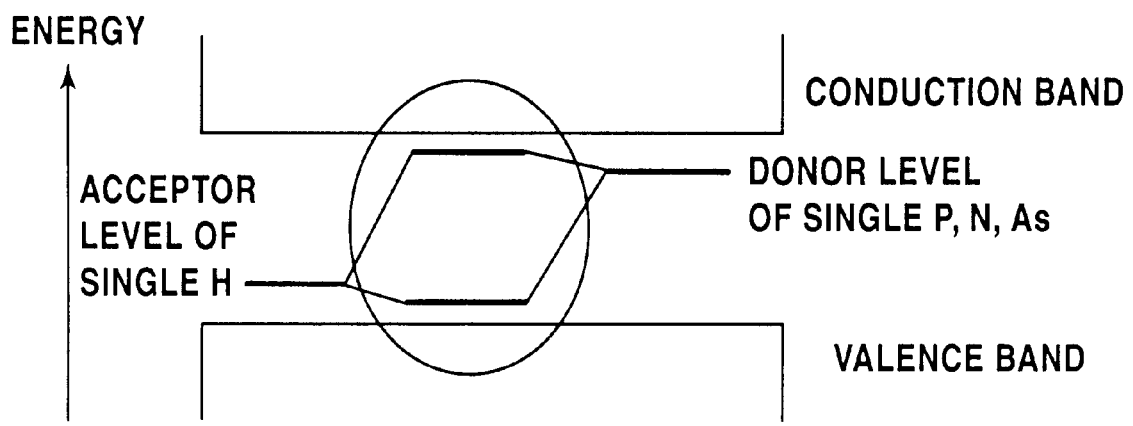
FIG. 1 is an explanatory view showing a principle that a donor level becomes lower by simultaneously doping a donor and an acceptor.
Figure 2:
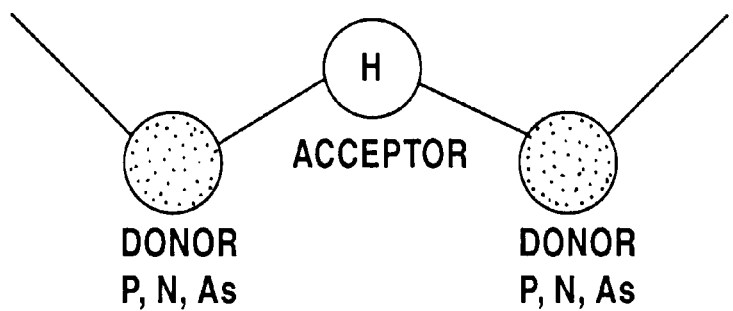
FIG. 2 is an explanatory view showing a donor-acceptor compound formed by simultaneously doping a donor and an acceptor.
Figure 3:
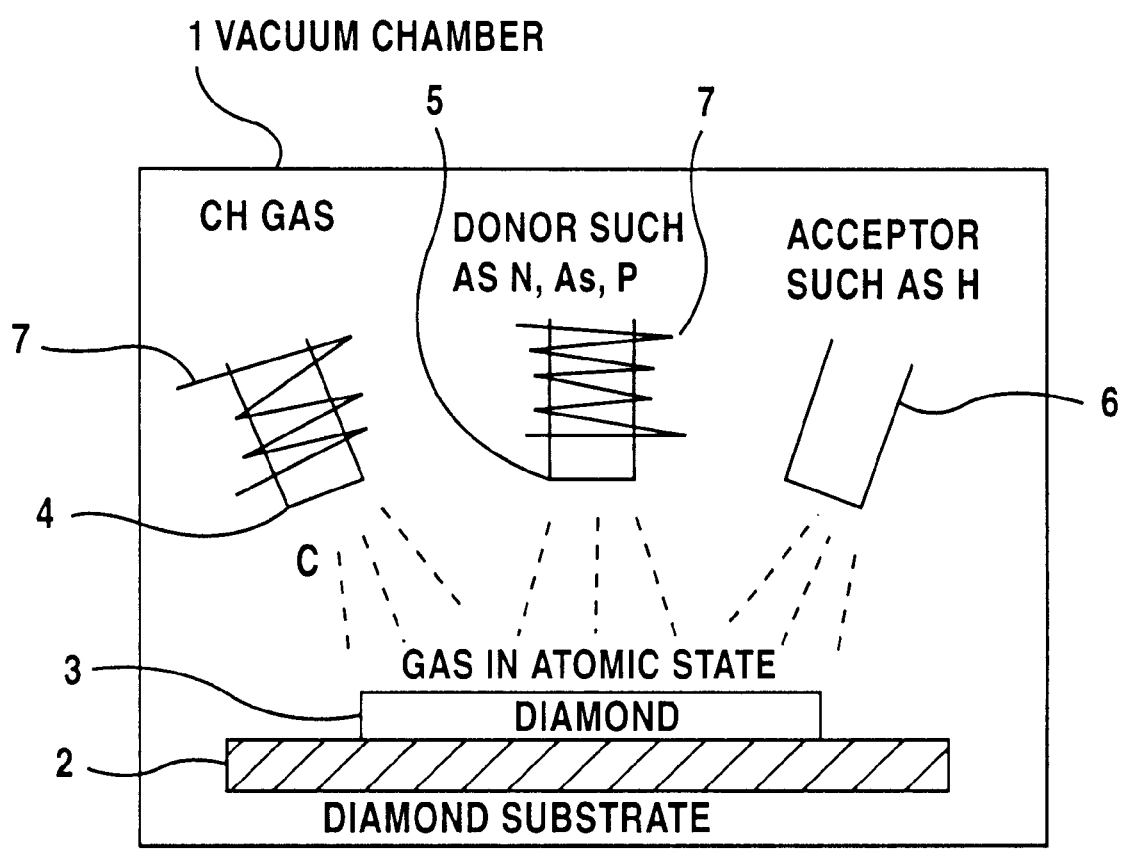
FIG. 3 is a side view showing a concept of a device for executing a simultaneous doping method for forming a diamond thin film in accordance with an MBE method.

FIG. 3 shows an example of a schematic side view of a device for executing an MBE method as one of the methods according to the present invention.

A diamond single crystal substrate 2 is fixed to a holder (not shown). The substrate 2 is heated to 300° C. to 950° C. by an electric heater (not shown) in a state that the vacuum chamber 1 is maintained in a vacuumed state by a vacuum evacuating device (not shown). Carbon hydride gas or hydrogen added carbon is introduced through a gas introducing pipe 4, and thermally decomposed by a RF coil 7 to be supplied in a molecular flow toward the substrate 2 so as to be adsorbed on the substrate 2.

A donor such as N, P or As is thermally decomposed by the RF coil 7, and is supplied toward the substrate 2 through the gas introducing pipe 5. Simultaneously, an acceptor such as H is doped by supplying it through the gas introducing pipe 6 toward the substrate 2, to thereby form a diamond 3 on the substrate. N, P or As as an n-type donor and H as a p-type acceptor may be atomic gas formed by irradiating an electromagnetic wave in a micro wave region to a molecular gas, or an atomic simplicial cell formed by heating at high temperature.

In forming the crystal, a carbon vapor partial pressure, an n-type dopant partial pressure and a p-type dopant partial pressure are controlled so as to increase the n-type dopant atomic density such that the atomic density of the n-type dopant is larger than that of the p-type dopant. In other words, the ratio of the atomic density of the p-type dopant to the n-type dopant is controlled such that the atomic density of the n-type dopant is larger than that of the p-type dopant, such as 1:2 to 1:3, to thereby form an n-type impurity compound in which the atomic density of the p-type dopant to the n-type dopant is 1:2 to 1:3.

Furthermore, after forming an n-type single crystal diamond thin film having low resistance on the semiconductor diamond substrate 2 under low temperature and low pressure, the thin film is once cooled, and annealed at high temperature for a short time in an electric field, so that the acceptor made of hydrogen is removed from the crystal so as to restore a passivation by a hydrogen. At this time, the amount of hydrogen acceptor as a p-dopant which easily moves in the crystal is controlled by electron exciting (electron beam irradiation) and thermal exciting such that the atomic density of the n-type dopant is a little bit larger than that of the p-type dopant, such as the atomic density ratio of the donor to the hydrogen acceptor is from 2:1 to 3:1.

Furthermore, an n-type single crystal diamond thin film having low resistance is formed by simultaneously doping a p-type dopant and an n-type dopant, to realize a negative electron affinity energy. This causes a higher level of electrons than a vacuum level. As a result, the diamond thin film can be used as an electron emitter for a large screen display, or the like. By irradiating a circular polarized electron beam to the n-type single crystal diamond thin film having low resistance showing the negative electron affinity energy to differentiate the number of electrons between the upwardly oriented spin and the downwardly oriented spin, electrons having a differentiated oriented spin can be taken out at low voltage. Thus, a highly efficient spin-polarized electron beam material can be manufactured.

In synthesizing an artificial diamond by a conventional high-temperature and high-pressure synthesizing method utilizing a nickel catalyst, an N or P compound including a large amount of H such as $NH_3$ in a non-diamond carbon such as a graphite, or an As compound is disposed in a high-temperature and high-pressure device. Then, H as a p-type dopant and one of N, P and As as an n-type dopant are mixed so that the atomic density ratio of the p-type dopant to the n-type dopant becomes 1:2 to 1:3 under normal high-temperature and high-pressure manufacturing conditions.

EXAMPLES

As shown in FIG. 3, the vacuum chamber 1 was maintained to be vacuum degree of $10^{-10}$ torr, and the substrate 2 was heated by the electrical heater. CH gas (hydrocarbon, methane, ethane, propane) was introduced through the gas introducing pipe 4, and was thermally decomposed by the RF coil 7 to supply the molecular flow toward the substrate 2 so as to be adsorbed on the substrate 2. P as a donor was emitted toward the substrate 2 through the introducing pipe 5 at the flow rate of $5 \times 10^{-9}$ torr, and H as an acceptor was emitted toward the substrate 2 from the introducing pipe 6 at the flow rate of $10^{-9}$ torr so as to simultaneously dope them, to thereby form a diamond 3 at the substrate temperature of 400° C., 450° C., 600° C., 800° C. and 900° C. P as a donor and H as an acceptor were electrically excited by the RF coil 7 so as to become an atomic gaseous state. After 90 minutes had passed, the crystal growth was interrupted.

The obtained single crystal diamond thin film had thickness as shown in Table 1. In a case of simultaneous doping of P and H, the n-type carrier density was higher by a few digits at any crystal growth temperatures, as compared to the case where only the P vapor as a n-type donor was doped without feeding H vapor as a p-type dopant.

Furthermore, the donor density was different depending on the crystal growth temperature (the substrate temperature). The donor density was $1 \times 10^{20}$ cm$^{-3}$ or more at the substrate temperature of 800° C. In addition, the film resistance was 1.0 Ωcm or less, as shown in Table 1.

TABLE 1

| Substrate Temperature (° C.) | Film thickness (μm) | Simultaneous doping of P and H | | Single doping of P | |
|---|---|---|---|---|---|
| | | Donor density (cm$^{-3}$) | Film resistance (Ω cm) | Donor density (cm$^{-3}$) | Film resistance (Ω cm) |
| 400 | 0.01 | $4 \times 10^{18}$ | 0.83 | $1 \times 10^{14}$ | 4120 |
| 450 | 0.09 | $5 \times 10^{18}$ | 0.52 | $2 \times 10^{14}$ | 3150 |
| 600 | 0.21 | $6 \times 10^{19}$ | 0.45 | $3 \times 10^{14}$ | 2180 |
| 800 | 0.82 | $8 \times 10^{20}$ | 0.35 | $3 \times 10^{14}$ | 1210 |
| 900 | 1.03 | $8 \times 10^{21}$ | 0.20 | $4 \times 10^{15}$ | 400 |

Industrial Applicability

According to the method of the present invention, an n-type diamond can be synthesized as a single crystal diamond thin film. Therefore, it is possible to manufacture a high power and high speed semiconductor device using a diamond operable at high temperature, and an ultraviolet semiconductor laser diode essential for a high density recording and a vast information transmittance by a diamond.

It is also possible to manufacture an n-type transparent single crystal protective film having low resistance, which utilizes high hardness characteristics of a diamond. Furthermore, since an n-type single crystal diamond thin film having low resistance can be manufactured by simultaneously doping a p-type dopant and an n-type dopant, negative electron affinity energy can be obtained. Thus, by irradiating a circular polarized laser to the thin film, it is possible to manufacture a high-power and high-speed display operable at high temperature and having a large screen area made by highly efficient electron beam materials.

What is claimed is:

1. A method for synthesizing an n-type diamond single crystal thin film having low resistance, the method including the steps of:
    forming a single crystal diamond thin film on a substrate by a vapor-phase growth method or a sputtering method; and
    simultaneously doping N, P or As as an n-type dopant, and H as a p-type dopant in a crystal to form a donor-acceptor pair in the crystal, to thereby synthesize the n-type diamond single crystal thin film having low resistance.

2. The method for synthesizing an n-type diamond single crystal thin film having low resistance as recited in claim 1, wherein an atomic N, P or As as an n-type dopant and an atomic H as a p-type dopant electrically excited by a radio wave, a laser, an x-ray, or an electron beam, are simultaneously doped.

3. The method for synthesizing an n-type diamond single crystal thin film having low resistance as recited in claim 1, wherein carbon vapor partial pressure, n-type dopant partial pressure and p-type dopant partial pressure are controlled such that the n-type dopant atomic density becomes larger than the p-type dopant atomic density.

4. A method for restoring a passivation by a hydrogen, including the steps of:
    subjecting a single crystal diamond thin film synthesized by the method as recited in claim 1 to cooling; and then
    annealing it at high temperature for a short time in an electric field, so that the donor made of hydrogen is removed from the crystal.

5. A method for forming a high efficiency spin-polarized electron-beam, including the step of: irradiating a circular polarized laser on the single crystal diamond thin film synthesized by the method recited in claim 1.

6. A method for synthesizing an n-type diamond having low resistance, including the step of: mixing H as a p-type dopant and N, P or As as an n-type dopant so that the atomic density ratio of the p-type dopant to the n-type dopant is 1:2 to 1:3 before synthesizing the materials, in synthesizing an artificial diamond by a high-temperature and high-pressure synthesizing method utilizing a catalyst, to thereby form a donor-acceptor pair in the crystal.

7. The method for synthesizing an n-type diamond single crystal thin film having a low resistance as recited in claim 1, wherein N is the n-type dopant.

8. The method for synthesizing an n-type diamond single crystal thin film having a low resistance as recited in claim 1, wherein P is the n-type dopant.

9. The method for synthesizing an n-type diamond single crystal thin film having a low resistance as recited in claim 1, wherein As is the n-type dopant.

10. The method for synthesizing an n-type diamond single crystal thin film having a low resistance as recited in claim 1, wherein the donor intensity is $1\times10^{20}$ cm$^-$ or more at the substrate temperature of 800° C.

11. The method for synthesizing an n-type diamond single crystal thin film having a low resistance as recited in claim 1, wherein the film resistance is 1.0 Ωcm or less.

* * * * *